(12) United States Patent
Schlötterer et al.

(10) Patent No.: US 11,916,329 B2
(45) Date of Patent: Feb. 27, 2024

(54) ARRANGEMENT HAVING A HOUSING AND AN ELECTRICALLY CONDUCTIVE CONTACT SPRING, AND POWER SEMICONDUCTOR MODULE HAVING SAID ARRANGEMENT

(71) Applicant: SEMIKRON ELEKTRONIK GMBH & CO. KG, Nuremberg (DE)

(72) Inventors: André Schlötterer, Nuremberg (DE); Harald Kobolla, Seukendorf (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 18/219,042

(22) Filed: Jul. 6, 2023

(65) Prior Publication Data

US 2024/0022014 A1    Jan. 18, 2024

(30) Foreign Application Priority Data

Jul. 14, 2022    (DE) .................. 10 2022 117 625.8

(51) Int. Cl.
*H01R 13/502* (2006.01)
*H01L 23/04* (2006.01)
(Continued)

(52) U.S. Cl.
CPC ........... *H01R 13/502* (2013.01); *H01L 23/04* (2013.01); *H01L 23/49811* (2013.01); *H01R 13/24* (2013.01)

(58) Field of Classification Search
CPC ....... H01R 13/502; H01R 13/24; H01L 23/04; H01L 23/49811
See application file for complete search history.

(56) References Cited

U.S. PATENT DOCUMENTS 11,088,478 B2 *   8/2021   Ho ..................... H01R 13/2435
2018/0205168 A1 * 7/2018   Ju ..................... H01R 13/2435
(Continued)

FOREIGN PATENT DOCUMENTS

DE    102006021412 A1    11/2007
DE    102007024160 A1    12/2008
(Continued)

OTHER PUBLICATIONS

DE 10 2022 117 625.8, Search Report dated Mar. 14, 2023, 5 pages—German, 5 pages—English.

*Primary Examiner* — Abdullah A Riyami
*Assistant Examiner* — Nader J Alhawamdeh
(74) *Attorney, Agent, or Firm* — Andrew F. Young; NOLTE LACKENBACH SIEGEL

(57) ABSTRACT

An arrangement having a housing and an electrically conductive contact spring is presented, wherein the contact spring has a first and a second orthogonal main plane along its specified spring direction, wherein it is formed so as to be symmetric with respect to the first main plane, x-z plane, and asymmetric with respect to the second main plane, x-y plane, and also with respect to a rotation through 180° about the specified spring direction. The housing has a spring shaft for receiving the contact spring, and wherein this spring shaft likewise has a first and a second main plane, which coincides with the respective main plane of the contact spring, and wherein the spring shaft is formed so as to be symmetric relative to both main planes. And a power semiconductor module having such an arrangement.

17 Claims, 5 Drawing Sheets

(51) Int. Cl.
   *H01L 23/498* (2006.01)
   *H01R 13/24* (2006.01)

(56) References Cited

U.S. PATENT DOCUMENTS

2018/0331474 A1* 11/2018 Ju .................... H01R 12/7082
2019/0173207 A1*  6/2019 Ju .................... H01R 12/714
2023/0018797 A1*  1/2023 Jin ................... H01R 12/55

FOREIGN PATENT DOCUMENTS

DE     102011017500 A1   10/2012
DE     102022117625 B3    5/2023
WO     WO 2015/020176 A1  2/2015

\* cited by examiner

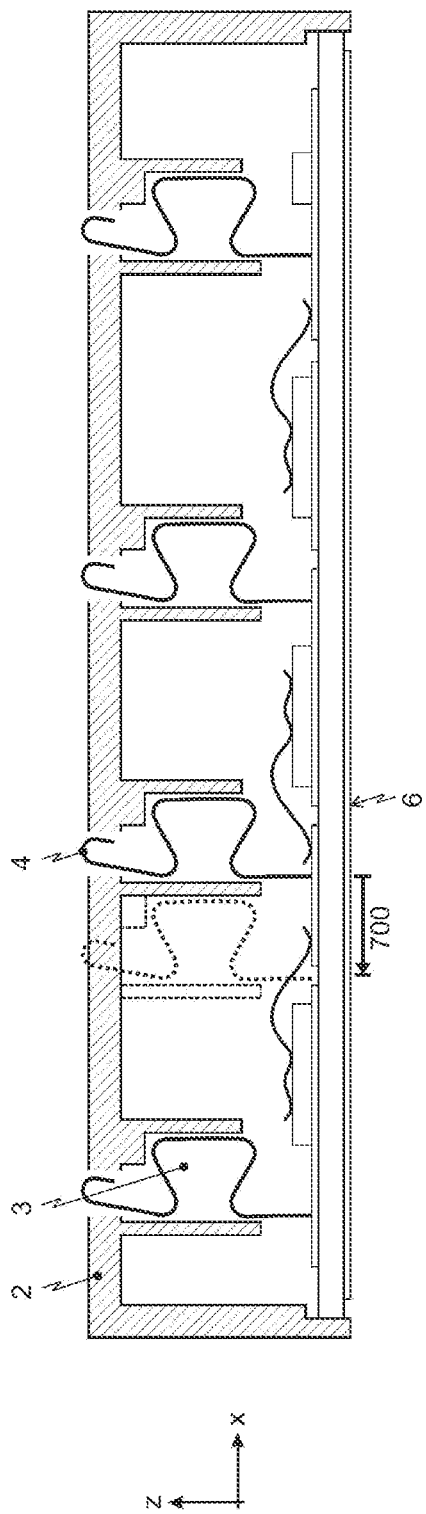
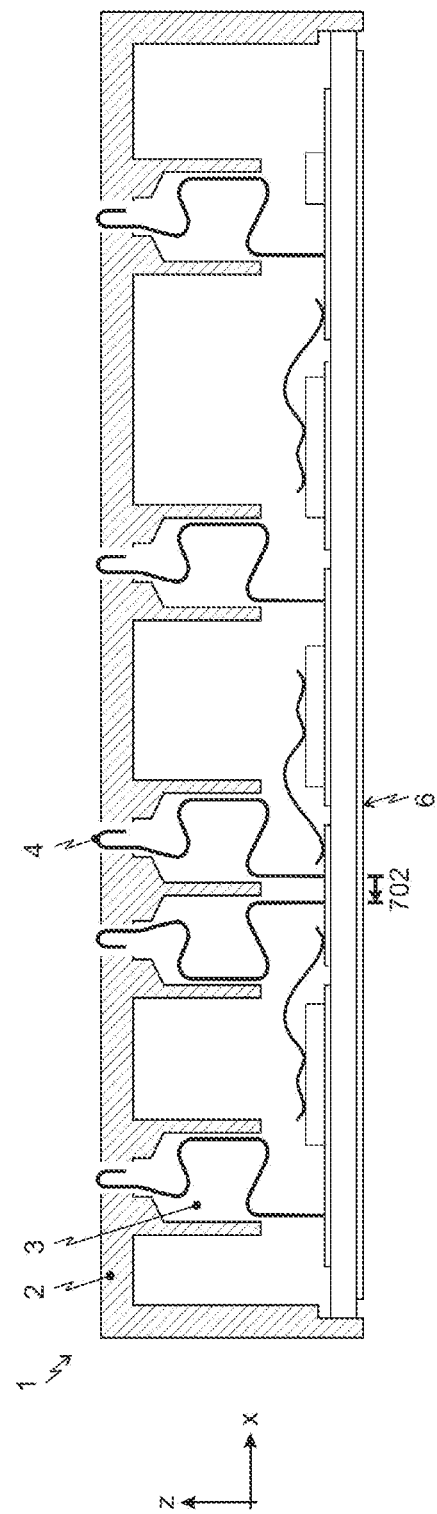

ARRANGEMENT HAVING A HOUSING AND AN ELECTRICALLY CONDUCTIVE CONTACT SPRING, AND POWER SEMICONDUCTOR MODULE HAVING SAID ARRANGEMENT

CROSS REFERENCE TO RELATED APPLICATIONS

This application relates to and claims priority to DE 10 2022 117 625.8 filed Jul. 14, 2022, the entire contents of which are incorporated herein fully by reference.

FIGURE SELECTED FOR PUBLICATION

FIG. 10.

BACKGROUND OF THE INVENTION

Field of the Invention

The invention describes an arrangement having a housing and an electrically conductive contact spring, wherein this contact spring has a first and a second orthogonal main plane along its specified spring direction, wherein the housing has a spring shaft for receiving the contact spring, and wherein this spring shaft likewise has a first and a second main plane, which coincide with the respective main plane of the contact spring. Furthermore, the invention describes a power semiconductor module having such an arrangement and having a power electronic substrate, which has a trace, wherein the substrate is arranged in the housing.

Description of the Related Art

DE 10 2006 021 412 B3 discloses a power semiconductor module having an electrically insulating substrate for arrangement of a printed circuit board, which is spaced apart from the substrate via a housing. First traces and, on these, power semiconductor devices are contacted on the inside of the substrate, which faces the printed circuit board, and can be activated by a control IC device. Second traces are provided on the inside of the printed circuit board, which faces the substrate. In the housing, resilient connecting elements are pressure-contacted between the first and the second traces by means of a dimensionally stable pressure body. An optimum electromagnetic compatibility is achieved in that, on the inside of the substrate, IC traces and the control IC device are also provided in addition to the first traces.

Aspects and Objects of the Invention

At least one of the objects of the present invention is to provide an improvement over the related art.

With knowledge of the said prior art, the object is based on the object of presenting an arrangement having a housing and an electrically conductive contact spring, wherein the contact spring can be arranged in two different ways in an associated spring shaft, and providing a power semiconductor module having such an arrangement.

This object is achieved according to the invention by an arrangement having a housing and an electrically conductive contact spring, wherein this contact spring has a first and a second orthogonal main plane along its specified spring direction, wherein it is formed so as to be symmetric with respect to the first main plane, x-z plane, and asymmetric with respect to the second main plane, x-y plane, and also with respect to a rotation through 180° about the specified spring direction, wherein the housing has a spring shaft for receiving the contact spring, and wherein this spring shaft likewise has a first and a second main plane, which coincide with the respective main plane of the contact spring, and wherein the spring shaft is formed so as to be symmetric with respect to both main planes.

The said asymmetry is therefore with respect to a mirror plane along the second main plane and also with respect to a rotation through 180° about the specified spring direction.

In the case of a spring shaft wherein the largest portion thereof has a rectangular cross-section, the first main plane of the spring shaft lies centrally in the y direction in the spring shaft, whilst its second main plane is perpendicular thereto and lies centrally in the x direction.

It may be advantageous here if the contact spring, owing to the symmetry of the spring shaft with respect to its second main plane, can be arranged in a non-twisted position in the spring shaft, and also twisted through 180° about its specified spring direction.

Essentially, it may be advantageous if the contact spring has a first and a second electrical contact portion and a spring portion arranged between them, and the first contact portion preferably has a contact surface arranged contrary to the specified spring direction and the second contact portion preferably has a contact surface arranged in the specified spring direction. A contact surface arranged contrary to the specified spring direction here shall be understood such that the contact surface has at least one portion whereof the normal vector faces contrary to the specified spring direction. A contact surface arranged in the specified spring direction here shall be understood to mean that the contact surface has at least one portion whereof the normal vector faces in the direction of the specified spring direction. In addition, it may be advantageous here if the second contact portion is arranged offset relative to the second main plane, i.e., in the x direction, when the arrangement is not twisted, as opposed to twisted, within the first main plane of the contact spring.

It is particularly advantageous if the spring portion is explicitly also already formed to be asymmetric with respect to the second main plane, x-y plane, and also with respect to a rotation through 180° about the specified spring direction.

Likewise, it may essentially be advantageous if the contact spring is arranged in a captive manner in the associated spring shaft by means of a first retaining means acting contrary to the specified spring direction. In particular, at the same time, it may be advantageous if the contact spring is arranged in a captive manner in the associated spring shaft by means of a second retaining means acting in the specified spring direction. It is particularly advantageous if the first and second retaining means are formed as a single common retaining means. "In a captive manner" shall, of course, be understood to mean that the retaining means prevents the contact spring from falling out of the spring shaft in relation to its direction of action.

The first retaining means here may be formed as a narrowing of the spring shaft relative to its first main plane and in the bearing region of the first contact portion.

The first retaining means may also cooperate with the spring portion of the contact spring.

To this end, it may be preferred if a peg with an extent in the y direction and formed in one piece with the housing, is formed as at least one of the retaining means.

Likewise, it may be preferred if a narrowing of the shaft in the x direction is formed either as at least one of the retaining means and, at the same time or alternatively, as a positioning means of the first contact portion of the contactors in the x direction.

In addition, it may be preferred if a narrowing of the shaft in the y direction is formed as a second retaining means cooperating with the spring portion.

It is particularly preferred if a clear width dimension of the positioning means formed as a narrowing is greater than a width dimension of the second retaining means formed as a peg. It is preferred here if, in a projection in the specified spring direction, the width dimension of the peg lies entirely within the clear width dimension of the narrowing.

Essentially, it may be preferred if the contact spring, which is preferably formed as a high-current contact element with a current carrying capacity of more than 10 A, is formed from a strip-like metal body with a rectangular cross section and deformations, in particular two S-shaped deformations, of this metal body for forming the spring portion. It may be preferred here if a connecting portion is arranged between two deformations of the spring portion, which connecting portion abuts with a main side against a first inner wall of the spring shaft, which is parallel to the second main plane of the spring shaft. It may also be preferred if the second contact portion abuts with a main side against a second inner wall of the spring shaft, which is opposite the first inner wall and parallel to the second main plane of the spring shaft. The term "abut" here shall explicitly not be understood as a force-fitting connection, since the spring portion must be movable relative to the spring shaft in the specified spring direction. The abutting action here serves for positioning in the x direction and for guiding the movement in the z direction.

The object is furthermore achieved according to the invention by a power semiconductor module having an above-mentioned arrangement according to the invention and having a power electronic substrate, which has a trace, wherein the substrate is arranged in the housing.

It may be advantageous here if the second contact portion, in particular its contact surface, is in electrically conductive, preferably force-fitting, contact with the trace.

It may be advantageous if the second contact portion is in electrically conductive contact with a first trace in the case of a non-twisted arrangement and with a second trace in the case of a twisted arrangement.

It may also be advantageous if the housing has a multiplicity of spring shafts, preferably arranged as a matrix, and wherein a contact spring is arranged in a non-twisted position in at least one of these spring shafts and at least one contact spring is arranged in a twisted position in a further one of these spring shafts. Furthermore, it may be advantageous here if at least one of these spring shafts is unoccupied, i.e. a contact spring is not arranged therein.

Of course, the features or groups of features mentioned in the singular in each case, for example the contact spring and the respectively associated spring shaft, may be present multiple times in the arrangement according to the invention or in the power semiconductor module according to the invention, unless this is explicitly precluded or precluded per se or is inconsistent with the concept of the invention.

It goes without saying that the various configurations of the invention, regardless of whether they are mentioned in connection with the arrangement or with the power semiconductor module, may be realized individually or in any desired combinations in order to achieve improvements. In particular, the features mentioned and explained above and below may be implemented not only in the combinations indicated, but also in other combinations or in isolation without deviating from the scope of the present invention.

Further explanations of the invention, advantageous details and features can be found in the description below of the exemplary embodiments of the invention, or respective parts thereof, which are illustrated schematically in FIGS. 1 to 10.

The above and other aspects, features, objects, and advantages of the present invention will become apparent from the following description read in conjunction with the accompanying drawings for exemplary but nonlimiting embodiments, in which like reference numerals designate the same elements.

BRIEF DESCRIPTION OF THE DRAWINGS

FIGS. 1, 7 and 9 show an arrangement according to the prior art and a power semiconductor module having this arrangement in various views.

FIG. 8 shows a power semiconductor module according to the invention.

DETAILED DESCRIPTION OF THE PREFERRED EMBODIMENTS

Figure 1:
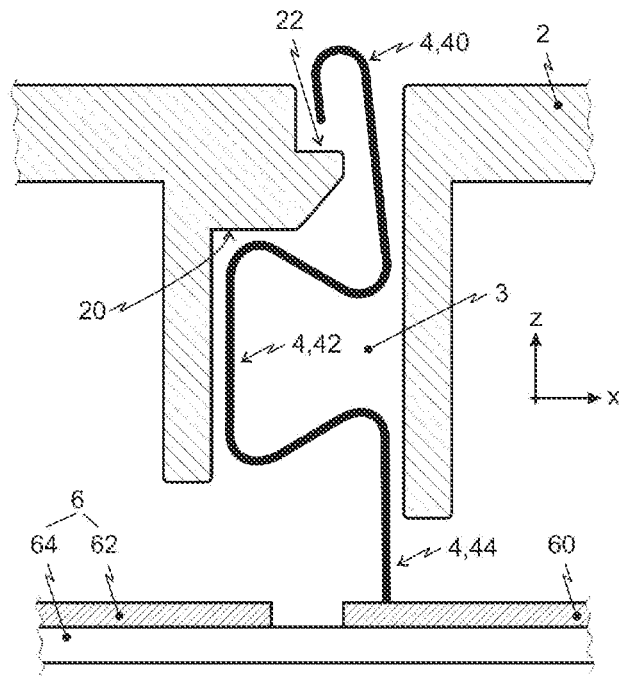

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'bond' or and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 9:
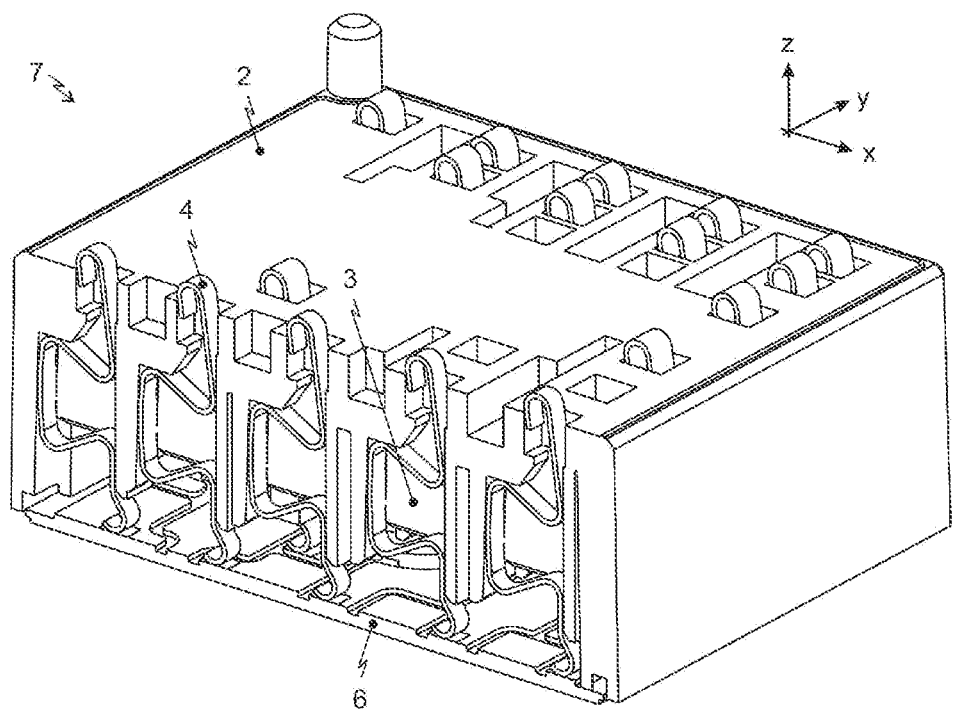

FIGS. 1, 7 and 9 show an arrangement according to the prior art and a power semiconductor module having this arrangement in various views. The power semiconductor module 7 illustrated in a three-dimensional sectional view according to FIG. 9 comprises a cup-like housing 2 with a power electronic substrate 6 arranged herein, which therefore forms the cover of the cup-like housing 2. As is customary in the art, this substrate 6 is a substrate based on an insulating ceramic and having a multiplicity of traces 60, 62, c.f. FIG. 1. Power semiconductor devices are arranged on the traces 60, 62 and connected with appropriate circuitry.

The external connection elements, i.e. reaching outwards from the substrate 2, are formed as high-current contact elements and, more precisely, as contact springs 4. Such contact springs 4 may conduct currents of 10 A and more.

Each of the contact springs 4 is arranged in a spring shaft 3 of the housing 2. These spring shafts 3 are formed in such a way that the associated contact spring 4 may be inserted into the spring shaft 3 from the open side of the cup-like housing 2. FIG. 7 shows an essentially identically designed power semiconductor module 7 in a two-dimensional sectional view, wherein the contact springs 4 are designed slightly differently here.

FIG. 1 shows the position of a contact spring 4 in the associated spring shaft 3. The contact spring 4 itself has a first electrical contact 40 here, which protrudes partially out of the spring shaft 3 and therefore out of the housing 2, c.f. also FIGS. 7 and 9. The contact spring 4 furthermore has a second electrical contact portion 44 for electrically conductive connection to a trace 60, 62 of the substrate. A spring portion 42 is arranged between the two contact portions.

After inserting the contact spring 4 into the spring shaft 3, this contact spring is arranged in a captive manner therein since two retaining means 20, 22 of the housing 2 secure the contact spring 4 against falling out.

FIGS. 2, 3, 5 and 6 each show various configurations of an arrangement 1 according to the invention in combination with a substrate 6 of a power semiconductor module. A spring shaft 3 with a contact spring 4 arranged therein is shown in each case, wherein the underlying power semiconductor module in these exemplary embodiments resembles that according to FIGS. 1, 7 and 9, of course without the inventive differences. An installation position of the contact spring 4 is shown on the left of the respective figure; an alternative installation position is shown on the right, with the installation position of the part on the left shown again by dashed lines.

Figure 2:
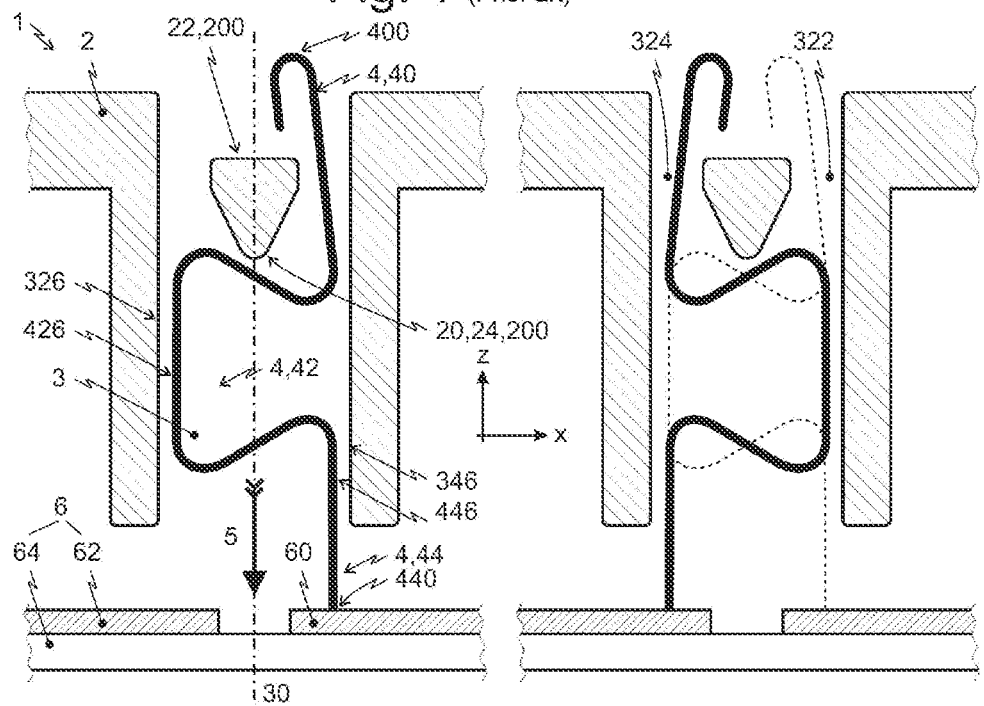
FIGS. 2, 3, 5 and 6 each show various configurations of an arrangement according to the invention, in combination with a substrate of a power semiconductor module.
Figure 10:
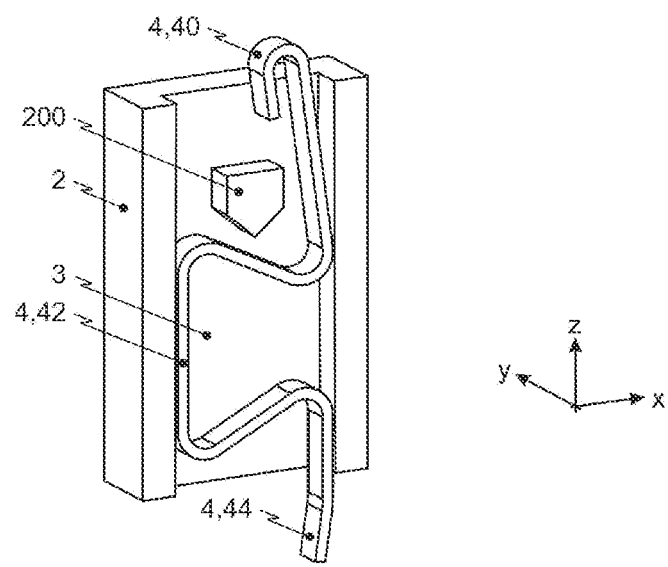
FIG. 10 shows an arrangement according to FIG. 2 in a three-dimensional sectional view.

FIG. 2 shows an arrangement 1 having a housing 2 and a contact spring 4 arranged in a spring shaft, and, additionally, a power electronic substrate 6 of a power semiconductor module 7. FIG. 10 shows this arrangement in a three-dimensional sectional view.

The electrically conductive contact spring 4 has a first and a second electrical contact portion 40, 44 and a spring portion 42 arranged between them. The first contact portion 40, which protrudes partially out of the housing 2, has a bend and, by means of a contact surface 400 arranged thereon, serves for electrically conductive force-fitting connection to a printed circuit board trace of a printed circuit board (not illustrated) arranged parallel to the substrate 6. The second contact portion 44, by means of a contact surface 440 arranged thereon, serves for electrically conductive force-fitting connection to a first trace 60 of the substrate 6. The specified spring direction 5 of the contact spring 4 is the negative z direction. By introducing a force onto the printed circuit board, the contact spring 4, and more precisely its spring portion 42, is tensioned, wherein the first contact portion 40 moves towards the substrate 6 in the specified spring direction 5, whereby the respective force-fitting electrically conductive connections are formed. The counter-force is generated by the spring portion 42 of the contact spring 4. This configuration also applies to the further exemplary embodiments according to FIGS. 3, 5 and 6.

The spring shaft 3 has a cuboidal basic form here, which is formed as an opening reaching through the housing 2 in the z direction. A peg 200 reaches through the spring shaft 3 in the y direction, whereby the spring shaft 3 still has two planes of symmetry, the first and second main plane, instead of the three present in a cuboid. The first main plane here is formed by the x-z plane, whilst the second main plane 30 is formed by the x-y plane.

The electrically conductive contact spring 4, as a high-current contact element, has a current carrying capacity of more than 10 A. To this end, it is formed from a strip-like metal body with a rectangular cross section and two S-shaped deformations of this metal body for forming the spring portion 42. Therefore, this contact spring 4 has only one plane of symmetry, whereby it is formed so as to be symmetric relative to its first main plane coinciding with that of the spring shaft 3 and to be asymmetric relative to its second main plane 30 coinciding with that of the spring shaft 3 and also to a rotation through 180° about the specified spring direction 5. The specified spring direction 5 of the contact spring 4 is parallel to both main planes and forms the line of intersection of these two main planes.

Owing to the said symmetry properties of the spring shaft 3 and the contact spring 4, the contact spring 4 may be arranged in two installation positions in the spring shaft 3, wherein the two installation positions transition into one another as a result of a rotation through 180° about the specified spring direction 5. The installation position shown on the left here shall be understood to be the non-twisted position, whilst the twisted position is shown on the right, with the non-twisted installation position shown again by dashed lines.

A connecting portion is arranged between the two S-shaped deformations of the spring portion 42, which connecting portion abuts with a main side 426 against a first inner wall 326 of the spring shaft 3, which is parallel to the second main plane of the spring shaft 3. The spring portion 42 of the contact spring 4, and not only the contact spring 4 as a whole, therefore itself has an asymmetric form with respect to the second main plane 30 and also with respect to a rotation through 180° about the specified spring direction 5. In one portion, the second contact portion 44 abuts with a main side 446 against a second inner wall 346 of the spring shaft 3, which is opposite the first inner wall and parallel to the second main plane of the spring shaft 3.

Due to the configuration of the spring portion 42 and the contact spring 4 as a whole, in the case of a non-twisted arrangement of the contact spring 4, the second contact portion 44 is in electrically conductive contact with a first trace 60 of the substrate 6, whilst, in the case of a twisted arrangement of the contact portion 44, it is in electrically conductive contact with a second trace 62 of the substrate 6. The two contact points lie symmetrically with respect to the second main plane 30 of the spring shaft 3.

A first opening 322 is formed between the peg 200 and the second inner wall 346 of the spring shaft 3. Owing to the symmetry, a second mirror-symmetric opening 324 is formed between the peg 200 and the first inner wall 326 of the spring shaft 3. When mounting the contact spring 4, c.f. also FIG. 4, the first contact portion 40 thereof is guided through the first opening 322, wherein it is deflected relative to the spring portion 42 in the x direction at a sliding edge of the V-shaped portion of the peg 200 and springs back into its original position (illustrated here) relative to the spring portion 42 after mounting is complete. The illustrated arrangement is then formed, in which the peg 300 has a surface which is parallel to the substrate 6 and acts as a second retaining means 22. During this, the bend of the first contact portion 40 cooperates with the surface of the peg 200 in such a way that the bend lies on the surface in the specified spring direction 5, and without a spring load of the contact spring 4, and therefore prevents the contact spring 4 from moving out of the spring shaft 3 in the specified spring direction 5. Of course, the same also applies for the twisted installation position.

The peg 200 also fulfils the function of the first retaining means 20, wherein, to this end, it cooperates with the spring portion 42. Owing to the dimensions in the x direction of the spring portion 42, the peg 200 forms a barrier to prevent the contact spring 4 from moving out of the spring shaft 5 contrary to the specified spring direction 5.

The peg 200 therefore forms a common retaining means 24 and brings about a completely captive arrangement of the contact spring 4, i.e. acting in and contrary to the specified spring direction 5, which is necessary in particular so long as the power semiconductor module 7 is not fully mounted and the contact spring 4 is then subject to pressure.

Figure 3:
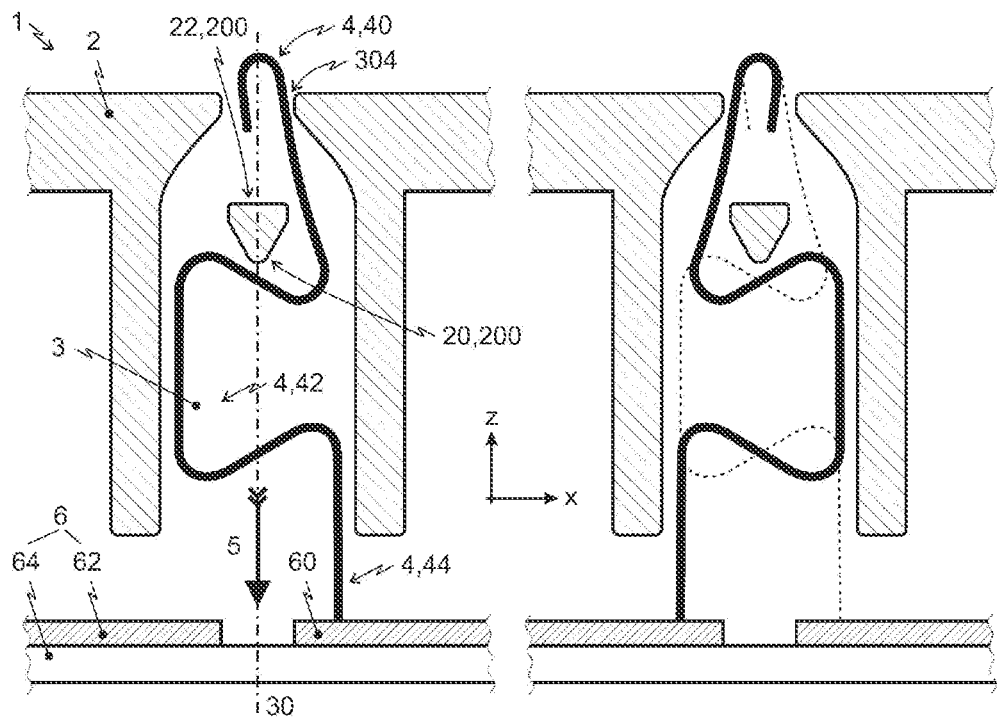

FIG. 3 shows a further arrangement 1, wherein, in contrast to the arrangement according to FIG. 2, the spring shaft 3 has a narrowing 304 at its outer end, i.e. in the bearing region of the first contact portion 40 of the contact spring 4, wherein its above-mentioned symmetry is maintained. The narrowing 304 here serves primarily as a positioning means of the first contact portion 40 in the x direction. The narrowing 304 has a clear width dimension 314, in the x direction, which is slightly greater than the width dimension of the first contact portion 40. In contrast to the configuration according to FIG. 2, therefore, the position of the first contact portion 40 of the contact spring 4 in the x direction is the same in both the non-twisted and twisted installation position due to the positioning means, i.e. the narrowing 304.

Figure 4:
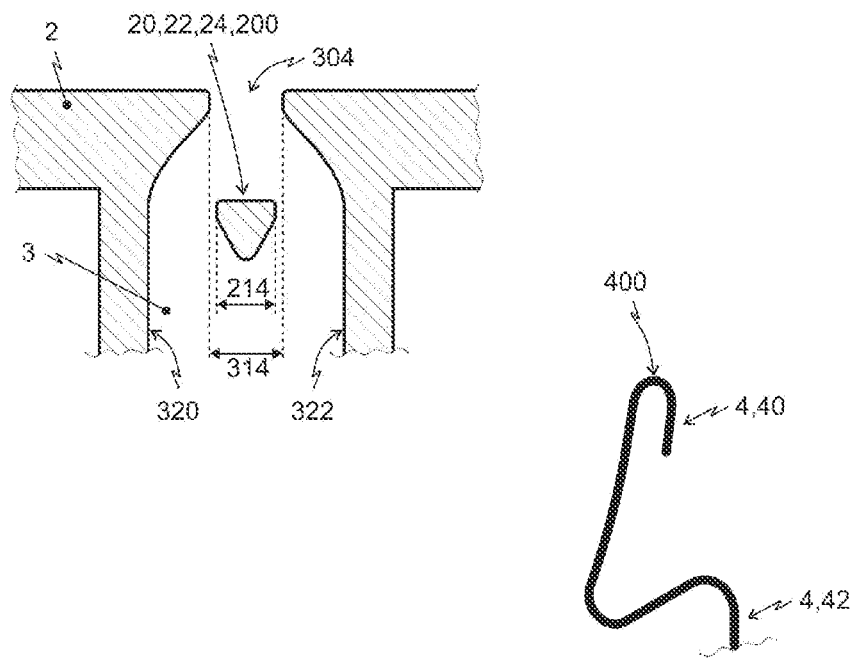
FIG. 4 shows several further details of the configuration according to FIG. 3.

FIG. 4 shows several further details of the configuration according to FIG. 3, wherein a portion of the spring shaft 3 and of the contact spring 4 are not shown in their installation position here. It is shown here that the clear width dimension 314 of the narrowing 304 in the x-direction is greater than a width dimension 214 of the second retaining means 22, formed as a peg 200, in the x direction. In addition, in a projection in the specified spring direction 5, the width dimension 214 of the peg 200 lies entirely within the clear width dimension 314 of the narrowing. As a result of both features, it is ensured that the housing 2 can be produced using conventional production methods for plastic bodies.

When mounting the contact spring 4 in the spring shaft 3 of the housing 2, the first contact device 40 is firstly deflected at the above-described sliding edge of the peg 200 and then, additionally, at a further sliding edge of the narrowing 304, and is finally guided in through the narrowest portion of the narrowing 304 and positioned there.

Figure 5:
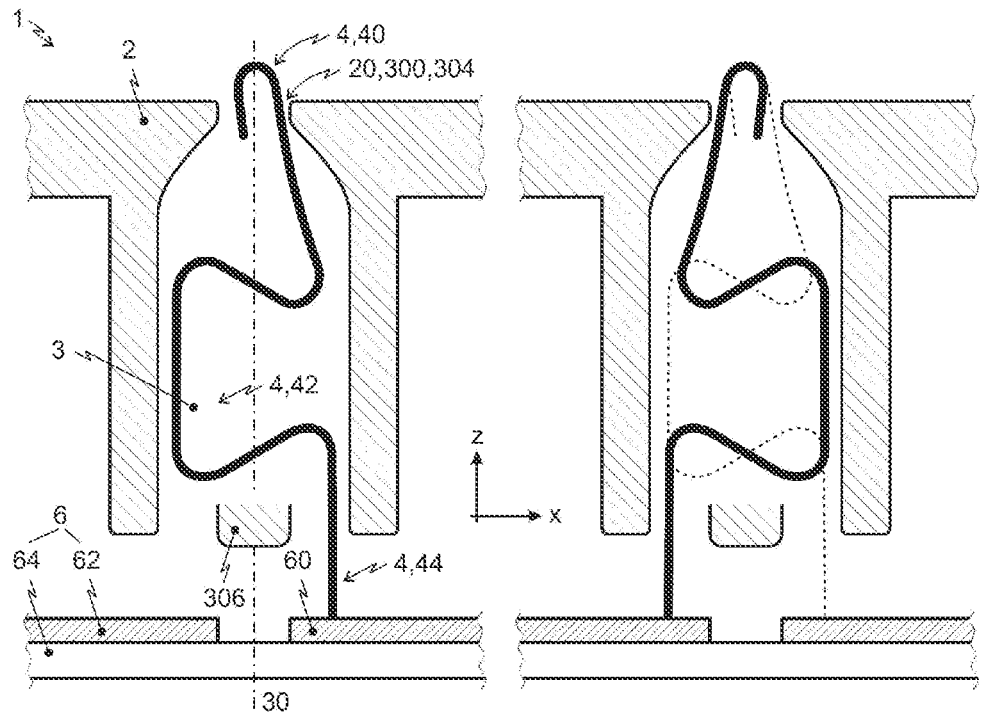

FIG. 5 shows a further arrangement 1, wherein, in contrast to the arrangement according to FIG. 4, this does not have a peg. Therefore, the narrowing 300, 304 (which is otherwise formed identically to FIG. 4) in the bearing region of the first contact portion 40 of the contact spring 4 acts not only as a positioning means but also as a first retaining means 20. Owing to their dimensions in the x direction, the contact springs 4 may not pass through the narrowing.

The function of the second retaining means 22 is assumed by a further narrowing 302 of the spring shaft 3 here. This further narrowing 306 is formed as two deformations of the spring shaft 3 in the transition region between the spring portion 42 and the second contact portion 44 of the contact spring 4, which deformations are arranged preferably symmetrically with respect to the first main plane. The further narrowing 306 is formed, for example, by thermally assisted deformation of a housing portion only once the contact spring 4 is arranged in the spring shaft 3. The further deformation cooperates with the spring portion 42 in such a way that the narrowing 306 serves as a stop for the spring portion 42. The contact spring 4 is therefore arranged in a captive manner in the spring shaft 3 as a result of both narrowings 300, 306.

Figure 6:
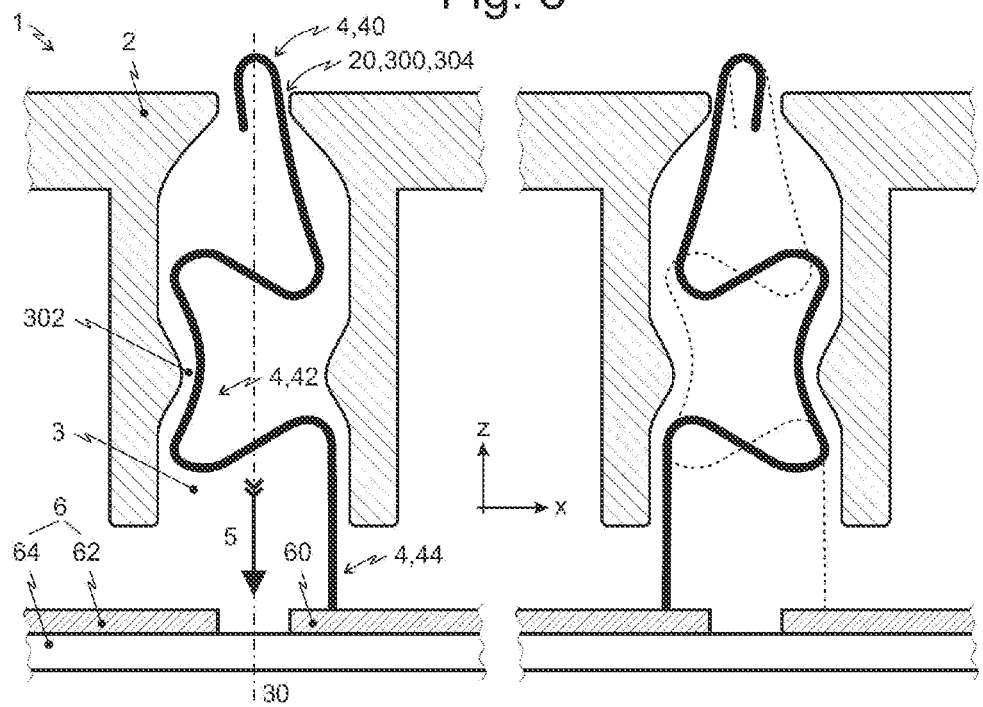

FIG. 6 shows a further arrangement 1, wherein, in contrast to the arrangement according to FIG. 5, this has a further narrowing 304 as a second retaining means in a different form. This narrowing is formed here as a symmetric constriction of the spring shaft 3 in the bearing region of the spring portion 42 of the contact spring 4. The connecting portion between the two S-shaped deformations of the spring portion 42 has a deformation corresponding to the further narrowing here, without restricting the necessary movement of the contact spring 4 in the specified spring direction 5 during operation. Therefore, the contact spring 4 is also arranged in a captive manner in the spring shaft 3 here as a result of both narrowings.

FIG. 8 shows a power semiconductor module 7 according to the invention in cross section and for comparison with the power semiconductor module according to the prior art according to FIG. 7. Both power semiconductor modules 7 have an above-described cup-like housing 2. In each case, as is customary in the art, the housing 2 surrounds a power electronic substrate 6 having a multiplicity of electrical traces 60, 62. Power semiconductor devices are arranged on some of these traces 60, 62 and connected internally with appropriate circuitry by wire bonding. For external contacting, the respective power semiconductor module 7 has a multiplicity of contact springs 4, which are arranged in associated spring shafts 3 of the housing 2.

In the case of power semiconductor modules 7, it is customary in the art for various circuit topologies to be realised with different layouts of the substrate 6 and, at the same, for the housing 2, including the position of the spring shafts 3, to be configured identically for at least a multiplicity of circuit topologies.

Provided that all spring shafts 3 are formed identically, the configuration of the power semiconductor module 7 according to the invention has the substantial advantage that each spring shaft 3 may receive a contact spring 4 in two different installation positions. As a result, the second contact devices 44 of the respective contact springs 4 may assume different positions on the substrate 6 in the x direction and therefore contact traces at different points or even contact different traces 60, 62, c.f. also FIGS. 2, 3, 5, 6, even without varying the position of the first contact portion in both installation positions here.

The minimum spacing 700, 702 in the x direction of the second contact elements 44 in the power semiconductor module 7 according to the invention may also be significantly smaller than in the power semiconductor module according to the prior art.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. An arrangement, comprising:

a housing and an electrically conductive contact spring;

the contact spring has a first orthogonal main plane and a second orthogonal main plane along its specified spring direction;

the contact spring is formed so as to be symmetric with respect to the first orthogonal main plane, an x-z plane, and to be asymmetric with respect to the second orthogonal main plane, an x-y plane, and also with respect to a rotation through 180° about a specified spring direction;

the housing has a spring shaft for receiving the contact spring, and wherein the spring shaft has a first main plane and a second main plane, which coincide with the respective first and second orthogonal main planes of the contact spring, and wherein the spring shaft is formed so as to be symmetric relative to both main planes; and the contact spring is arranged in a captive manner in the associated spring shaft by means of a first retaining means acting contrary to the specified spring direction;

wherein the contact spring, owing to the symmetry of the spring shaft, with respect to its second orthogonal main plane, can be arranged in a non-twisted position in the spring shaft, and also twisted through 180° about its specified spring direction;

wherein the contact spring has a first and a second electrical contact portion and a spring portion arranged between them;

the first contact portion has a first contact surface arranged contrary to the specified spring direction;

the second contact portion has a second contact surface arranged in the specified spring direction;

wherein the contact spring is arranged in a captive manner in the associated spring shaft by means of a second retaining means acting in the specified spring direction;

wherein a narrowing of the shaft in the x-direction is formed either as at least one of the retaining means and, at the same time or alternatively, as a positioning means of the first contact portion of the contactors in the x direction; and wherein a clear width dimension of the positioning means formed as a narrowing is greater than a width dimension of the second retaining means formed as a peg.

2. The arrangement, according to claim 1, wherein:

the second contact portion is arranged offset relative to the second main plane when the arrangement is not twisted, as opposed to twisted, within the first main plane of the contact spring.

3. The arrangement, according to claim 1, wherein:

the spring portion is formed so as to be asymmetric with respect to the second main plane and also with respect to a rotation through 180° about the specified spring direction.

4. The arrangement, according to claim 1, wherein:

the first and second retaining means are formed as a single common retaining means.

5. The arrangement, according to claim 1, wherein:

the first retaining means is formed as a narrowing of the spring shaft relative to its first main plane and in the bearing region of the first contact portion.

6. The arrangement, according to claim 1, wherein:

the first retaining means cooperates with the spring portion of the contact spring.

7. The arrangement, according to claim 1, wherein:

a peg with an extent in the y-direction and formed in one piece with the housing is formed as at least one of the retaining means.

8. The arrangement, according to claim 1, wherein:

a narrowing of the spring shaft in the y-direction is formed as a second retaining means cooperating with the spring portion.

9. The arrangement, according to claim 1, wherein:

in a projection in the specified spring direction, the width dimension of the peg lies entirely within the clear width dimension of the narrowing.

10. An arrangement comprising:

a housing and an electrically conductive contact spring;

the contact spring has a first orthogonal main plane and a second orthogonal main plane along its specified spring direction;

the contact spring is formed so as to be symmetric with respect to the first orthogonal main plane, an x-z plane, and to be asymmetric with respect to the second orthogonal main plane, an x-v plane, and also with respect to a rotation through 180° about a specified spring direction, the housing has a spring shaft for receiving the contact spring, and wherein the spring shaft has a first main plane and a second main plane, which coincide with the respective first and second orthogonal main planes of the contact spring, and wherein the spring shaft is formed so as to be symmetric relative to both main planes; and the contact spring is arranged in a captive manner in the associated spring shaft by means of a first retaining means acting contrary to the specified spring direction;

wherein the contact spring, owing to the symmetry of the spring shaft with respect to its second orthogonal main plane, can be arranged in a non-twisted position in the spring shaft, and also twisted through 180° about its specified spring direction;

wherein the contact spring has a first and a second electrical contact portion and a spring portion arranged between them;

the first contact portion has a first contact surface arranged contrary to the specified spring direction;

the second contact portion has a second contact surface arranged in the specified spring direction;

wherein the contact spring is arranged in a captive manner in the associated spring shaft by means of a second retaining means acting in the specified spring direction; and the contact spring, which is preferably formed as a high-current contact element with a current carrying capacity of more than 10 A, is formed from a strip-like metal body with a rectangular cross section and deformations, in particular two S-shaped deformations, of this metal body for forming the spring portion.

11. The arrangement, according to claim 10, wherein:

a connecting portion is arranged between two deformations of the spring portion, which connecting portion abuts with a main side against a first inner wall of the spring shaft, which is parallel to the second main plane of the spring shaft.

12. The arrangement, according to claim 10, wherein:

the second contact portion abuts with a main side against a second inner wall of the spring shaft, which is opposite the first inner wall and parallel to the second main plane of the spring shaft.

13. A power semiconductor module, comprising:
an arrangement, further comprising:
- a housing and an electrically conductive contact spring;
- the contact spring has a first orthogonal main plane and a second orthogonal main plane along its specified spring direction;
- the contact spring is formed so as to be symmetric with respect to the first orthogonal main plane, an x-z plane, and to be asymmetric with respect to the second orthogonal main plane, an x-y plane, and also with respect to a rotation through 180° about a specified spring direction;
- the housing has a spring shaft for receiving the contact spring, and wherein the spring shaft has a first main plane and a second main plane, which coincide with the respective first and second orthogonal main planes of the contact spring, and wherein the spring shaft is formed so as to be symmetric relative to both main planes; and,
- the contact spring is arranged in a captive manner in the associated spring shaft by means of a first retaining means acting contrary to the specified spring direction;
- wherein the contact spring, owing to the symmetry of the spring shaft with respect to its second orthogonal main plane, can be arranged in a non-twisted position in the spring shaft, and also twisted through 180° about its specified spring direction;
- wherein the contact spring has a first and a second electrical contact portion and a spring portion arranged between them;
- the first contact portion has a first contact surface arranged contrary to the specified spring direction, and
- the second contact portion has a second contact surface arranged in the specified spring direction;
- wherein the contact spring is arranged in a captive manner in the associated spring shaft by means of a second retaining means acting in the specified spring direction,
- wherein the contact spring, which is preferably formed as a high-current contact element with a current carrying capacity of more than 10 A, is formed from a strip-like metal body with a rectangular cross section and deformations, in particular two S-shaped deformations, of this metal body for forming the spring portion;
- a power electronic substrate, which has a trace; and
- wherein the substrate is arranged in the housing.

14. The power semiconductor module, according to claim 13, wherein:
- the second contact portion, in particular its contact surface, is in electrically conductive, preferably force-fitting, contact with the trace.

15. The power semiconductor module, according to claim 14, wherein:
- the second contact portion is in electrically conductive contact with a first trace in the case of a non-twisted arrangement and in contact with a second trace in the case of a twisted arrangement.

16. The power semiconductor module, according to claim 13, wherein:
- the housing has a multiplicity of spring shafts, that are arranged as a matrix; and
- wherein a contact spring is arranged in a non-twisted position in at least one of these spring shafts and at least one contact spring is arranged in a twisted position in a further one of these spring shafts.

17. The power semiconductor module, according to claim 16, wherein:
- at least one of these spring shafts is not occupied and one of the contact springs is not arranged therein.

* * * * *